(12) United States Patent
Cho

(10) Patent No.: US 12,484,259 B2
(45) Date of Patent: Nov. 25, 2025

(54) NON-VOLATILE SEMICONDUCTOR MEMORY DEVICE AND METHOD OF MANUFACTURING THE SAME

(71) Applicant: SK keyfoundry Inc., Cheongju-si (KR)

(72) Inventor: Minkuck Cho, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 394 days.

(21) Appl. No.: 18/310,099

(22) Filed: May 1, 2023

(65) Prior Publication Data

US 2024/0170547 A1    May 23, 2024

(30) Foreign Application Priority Data

Nov. 22, 2022   (KR) .......................... 10-2022-0157546

(51) Int. Cl.
| | |
|---|---|
| *H10D 64/00* | (2025.01) |
| *H10D 30/01* | (2025.01) |
| *H10D 30/68* | (2025.01) |
| *H10D 64/01* | (2025.01) |

(52) U.S. Cl.
CPC ..... *H10D 30/6892* (2025.01); *H10D 30/0411* (2025.01); *H10D 30/683* (2025.01); *H10D 64/035* (2025.01)

(58) Field of Classification Search
CPC .. H10H 20/857; H10H 20/01; H10H 20/8312; H10H 20/0364; H10H 20/03; H10H 20/819; H10H 20/013; H10H 20/81; H10H 20/812; H10H 20/814; H10H 20/821

USPC .......................................................... 257/79
See application file for complete search history.

(56) References Cited

U.S. PATENT DOCUMENTS

| | | | |
|---|---|---|---|
| 6,091,104 A | 7/2000 | Chen | |
| 6,642,103 B2 | 11/2003 | Wils et al. | |
| 6,784,476 B2 | 8/2004 | Kim et al. | |
| 6,803,276 B2 | 10/2004 | Kim et al. | |
| 6,885,058 B2 | 4/2005 | Wils et al. | |
| 8,895,397 B1* | 11/2014 | Shum ................. | H10D 30/0411 438/279 |

(Continued)

FOREIGN PATENT DOCUMENTS

| | | |
|---|---|---|
| KR | 10-2011-0068769 A | 6/2011 |
| KR | 10-2022-0152058 A | 11/2022 |

OTHER PUBLICATIONS

Korean Office Action issued on Jan. 22, 2024, in counterpart Korean Patent Application No. 10-2022-0157546 (9 pages in Korean).

*Primary Examiner* — Sheikh Maruf
(74) *Attorney, Agent, or Firm* — NSIP Law

(57) ABSTRACT

A semiconductor device includes a first source region and a drain region disposed on a substrate; a first gate stack comprising a first floating gate and a first control gate, and disposed between the first source region and the drain region; a first select gate disposed on one sidewall of the first gate stack; a first spacer disposed on a lower sidewall of the first select gate, and disposed adjacent to the first source region; a second spacer disposed on an upper sidewall of the first select gate; a first control gate silicide layer disposed on the first control gate; and a first select gate silicide layer disposed on the first select gate, and disposed between the first spacer and the second spacer.

13 Claims, 14 Drawing Sheets

(56) References Cited

U.S. PATENT DOCUMENTS

| | | | | |
|---|---|---|---|---|
| 2005/0207199 A1* | 9/2005 | Chen | ............ | H10B 69/00 |
| | | | | 257/E27.103 |
| 2014/0160854 A1* | 6/2014 | Lee | ............ | H10B 41/40 |
| | | | | 365/185.26 |
| 2015/0014761 A1* | 1/2015 | Hsu | ............ | H10D 30/0411 |
| | | | | 438/587 |
| 2015/0364481 A1* | 12/2015 | Mizushima | ............ | H10D 64/035 |
| | | | | 257/316 |
| 2016/0035576 A1* | 2/2016 | Bell | ............ | H10D 30/0413 |
| 2016/0049420 A1* | 2/2016 | Chang | ............ | H10D 64/021 |
| | | | | 438/591 |
| 2016/0049525 A1* | 2/2016 | Liu | ............ | H10D 30/0413 |
| | | | | 438/591 |
| 2016/0155860 A1* | 6/2016 | Shum | ............ | G11C 16/0425 |
| | | | | 257/326 |
| 2016/0181262 A1* | 6/2016 | Dhaoui | ............ | H10D 84/859 |
| | | | | 257/369 |
| 2018/0047737 A1* | 2/2018 | Chuang | ............ | H10D 30/6892 |
| 2018/0166135 A1* | 6/2018 | McCollum | ............ | H03K 19/17728 |
| 2018/0241398 A1* | 8/2018 | Greene | ............ | H10B 63/30 |

* cited by examiner

NON-VOLATILE SEMICONDUCTOR MEMORY DEVICE AND METHOD OF MANUFACTURING THE SAME

CROSS REFERENCE TO RELATED APPLICATION

The present application claims the benefit under 35 U.S.C. § 119(a) of Korea Patent Application No. 10-2022-0157546, filed Nov. 22, 2022, in the Korean Intellectual Property Office, the entire disclosure of which is incorporated herein by reference for all purposes.

BACKGROUND

1. Field

The following description relates to a structure and manufacturing method of a non-volatile semiconductor memory device.

2. Description of Related Art

A cell of a nonvolatile semiconductor memory device includes a source, a drain, a gate stack including a control gate, and a select gate electrically separated from the gate stack. Depending on the type of memory device, cells are connected in series or parallel. A cell leakage current may occur when cells are connected.

A select gate may be formed to reduce cell leakage current. When the select gate is formed adjacent to the control gate, the select gate may be in contact with the control gate through a silicide layer formed on each surface of the select gate and the control gate, which may cause a short circuit problem caused by a short distance between the control gate of the gate stack and the select gate. Accordingly, a semiconductor device having a structure that can solve the short circuit problem caused by the short distance between the control gate of the gate stack and the select gate is desirable.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a semiconductor device includes a first source region and a drain region on a substrate, a first gate stack comprising a first floating gate and a first control gate, and disposed between the first source region and the drain region, a first select gate disposed adjacent to the first gate stack, a first control gate silicide layer disposed on the first control gate, a first select gate silicide layer disposed on the first select gate, a first spacer disposed on a sidewall of the first select gate, and a second spacer disposed between the first select gate silicide layer and the first control gate silicide layer. The first select gate is disposed adjacent to the first floating gate, a first dielectric layer, and the first control gate.

The second spacer may be disposed on one sidewall of the first gate stack and is in contact with the first select gate.

The semiconductor device may further include a third spacer disposed on the other sidewall of the first gate stack, a first tunneling gate insulation layer disposed between the substrate and the first floating gate, a first select gate insulation layer disposed between the first select gate and the substrate, a drain silicide layer disposed on the drain region, and a first source silicide layer disposed on the first source region.

The first select gate may have a height lower than a height of the first control gate silicide layer.

The second spacer may contact the first control gate silicide layer and the select gate silicide layer.

The semiconductor device may further include a second source region disposed on the substrate, a second gate stack comprising a second floating gate and a second control gate, and disposed between the second source region and the drain region, a second select gate disposed adjacent to the second gate stack, and a second select gate insulation layer disposed between the second select gate and the substrate.

The semiconductor device may include a second control gate silicide layer disposed on the second control gate, a second select gate silicide layer disposed on the second select gate, a fourth spacer disposed on a sidewall of the second select gate, and a fifth spacer disposed between the second select gate silicide layer and the second control gate silicide layer, and the second select gate may be disposed adjacent to the second floating gate, a second dielectric layer, and the second control gate.

The fifth spacer may be disposed on a sidewall of the second gate stack and may be in contact with the second select gate.

In another general aspect, a method of manufacturing a semiconductor device includes forming a gate stack comprising a floating gate and a control gate on a substrate, forming a select gate insulation layer on the gate stack and the substrate, forming a select gate on the select gate insulation layer, simultaneously forming a first spacer on a sidewall of the select gate and a second spacer on a sidewall of the gate stack, forming a source region and a drain region, forming a select gate silicide layer on the select gate, and forming a control gate silicide layer on the control gate, and the second spacer may be disposed between the select gate silicide layer and the control gate silicide layer.

The forming of the select gate on the select gate insulation layer may include depositing a conductive layer on the select gate insulation layer, and performing an etch-back process on the conductive layer to form the select gate on the sidewall of the gate stack, and the select gate may have a height lower than a height of the gate stack.

The second spacer may be formed on the select gate insulating layer formed on the sidewall of the gate stack.

The second spacer may contact the select gate, the control gate silicide layer, and the select gate silicide layer.

The select gate may be disposed adjacent to the floating gate, a dielectric layer, and the control gate.

The forming of the gate stack may include sequentially forming a tunneling gate insulation layer, the floating gate, a dielectric layer, and the control gate on the substrate.

A thickness of the control gate may be greater than a thickness of the floating gate.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
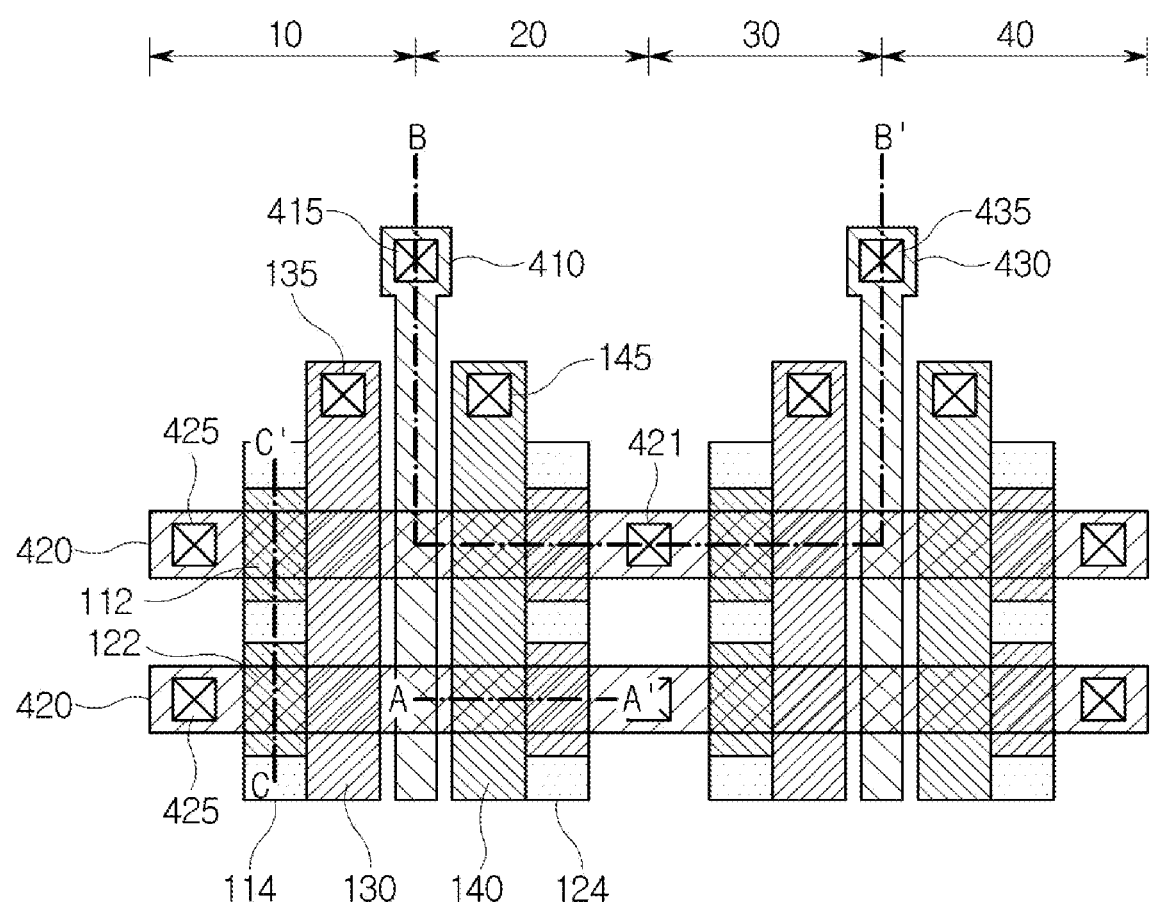
FIG. 1 illustrates a view showing an arrangement of cells of a non-volatile memory semiconductor device according to one or more embodiments of the present disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. Likewise, expressions, for example, "between" and "immediately between" and "adjacent to" and "immediately adjacent to" may also be construed as described in the foregoing.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Hereinafter, a structure of a non-volatile memory semiconductor device according to one or more embodiments of the present disclosure and a method of manufacturing the same will be described with reference to FIGS. 1 to 19.

FIG. 1 illustrates a view showing an arrangement of cells of a non-volatile memory semiconductor device according to one or more embodiments of the present disclosure. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

Referring to FIG. 1, the non-volatile memory semiconductor device may comprise a plurality of flash memory cells 10, 20, 30 and 40. In an example, the non-volatile memory semiconductor device may comprise a first flash memory cell 10, a second flash memory cell 20, a third flash memory cell 30 and a fourth flash memory cell 40. For example, the first and second flash memory cells 10 and 20 may comprise control gates 114 and 124, select gates 130 and 140, floating gates 112 and 122. The select gates 130 and 140 are also referred to as 'access transistors' or 'select transistors'.

The first and second flash memory cells 10 and 20 may further comprise a source line 410 and a bit line 420. The source line 410 and the bit line 420 may be connected to a source contact plug 415 and a drain contact plug 425, respectively. The first and second flash memory cells 10 and 20 may further comprise a word line (not illustrated). The third and fourth flash memory cells 30 and 40 have also the same structure as the first and second flash memory cells 10 and 20. The four flash memory cells 10-40 may be disposed symmetrically with a respect to bit line contact plug 421.

Referring to FIG. 1, all flash memory cells in one column may be connected to one control gate 114 or 124. In addition, all flash memory cells in another column may be connected to one select gate 130 or 140. Select gate contact plugs 135 or 145 may be provided on one side of one select gate 130 or 140. In addition, all flash memory cells in one column may be connected to one source line 410 or 430, and source contact plugs 415 or 435 may be provided on one side of one source line 410 or 430.

Also, all flash memory cells in one row may be connected to one bit line 420, and the drain contact plug 425 may be provided between the control gates 114 and 124. The floating gates 112 and 122 may be provided separately for each flash memory cell. The floating gates 112 and 122 may be provided separately for each flash memory cell, while being enclosed by dielectric layers (not illustrated) below the control gates.

Figure 2:
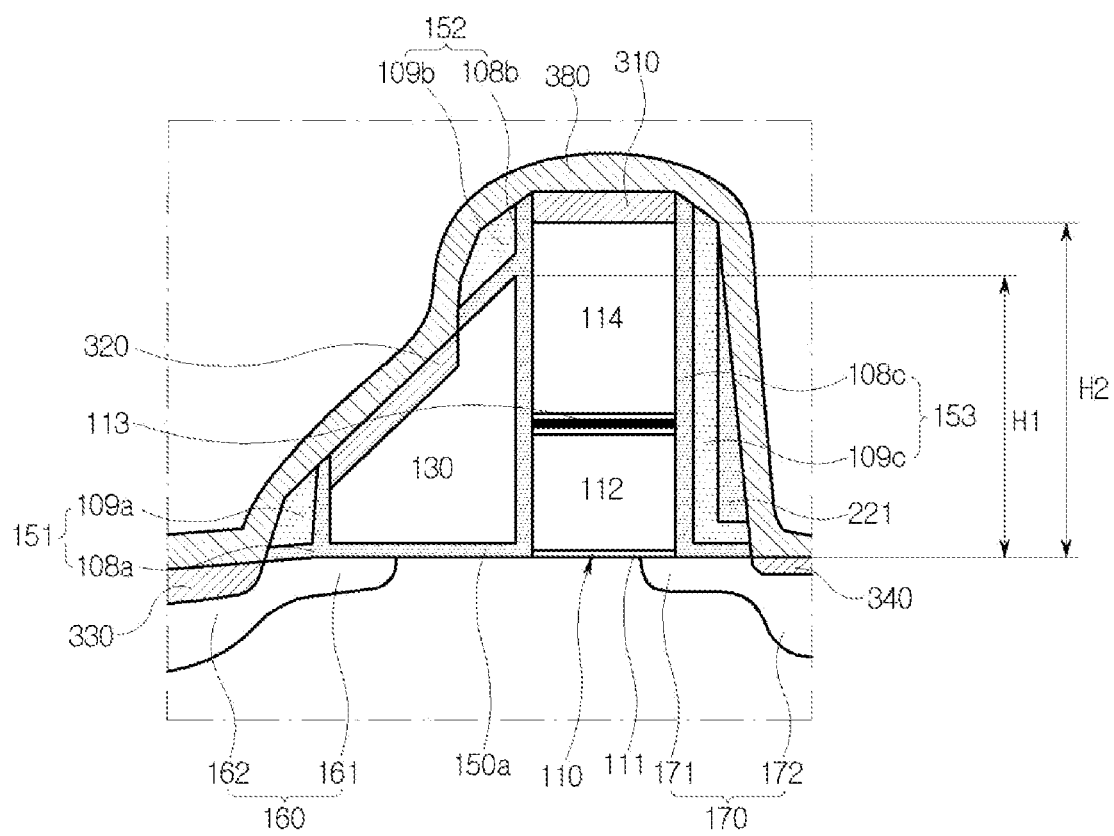
FIG. 2 illustrates a cross-sectional view of a flash cell structure of a non-volatile memory semiconductor device according to one or more embodiments of the present disclosure.

FIG. 2 illustrates a cross-sectional view of a flash cell structure of a non-volatile memory semiconductor device according to one or more embodiments of the present disclosure. FIG. 2 illustrates a cross-sectional view of portions A-A' in FIG. 1, which is a cross-section between the source region and the drain region in the second flash cell structure 20.

Referring to FIG. 2, in an example, one cell of the nonvolatile memory semiconductor device may include a first source region 160 and a drain region 170 formed on a substrate 100 to be spaced apart from each other.

A first gate stack 110 and a first select gate 130 may be disposed between the first source region 160 and the drain region 170 on the substrate 100. A channel may be formed between the first source region 160 and the drain region 170 by a voltage applied to the first gate stack 110 and the first select gate 130.

The first gate stack 110 may include a tunneling gate insulation layer 111, the floating gate 112, a dielectric layer 113, and the control gate 114 sequentially stacked on the substrate 100. Here, a thickness of the control gate 114 may be formed greater than a thickness of the floating gate 112.

The tunneling gate insulation layer 111 may be disposed on a surface of the substrate 100, and electrically insulate the substrate 100 and the first gate stack 110 from each other. The tunneling gate insulation layer 111 may comprise an oxide layer and may control transferring of charges stored in the floating gate 112 to the substrate 100.

The floating gate 112 may be disposed on the tunneling gate insulation layer 111. The floating gate 112 may comprise a poly-Si layer and may store preset data in the form of electric charges. The floating gate 112 may transfer the stored charges to the substrate 100 according to a voltage transferred from the control gate 114. The charges transferred to the floating gate 112 may form a channel between the first source region 160 and the drain region 170 of the substrate 100.

The dielectric layer 113 may be disposed on the floating gate 112 and may control transferring of charges stored in the floating gate 112 to the control gate 114. The dielectric layer 113 may comprise a single layer comprising silicon oxide, silicon nitride, or silicon oxynitride, or formed in a stacked structure of silicon oxide, silicon nitride, and silicon oxynitride. Depending on heights of the dielectric layer 113 and the tunneling gate insulation layer 111, the intensity of voltage transmitted from the gate to the substrate 100 may vary.

The control gate 114 may be disposed on the dielectric layer 113. The control gate 114 may comprise a poly-Si layer. A first control gate silicide layer 310 may be formed on an upper surface of the control gate 114. The control gate 114 may receive a voltage from an outside through the first control gate silicide layer 310. The voltage transmitted to the control gate 114 may be transmitted to the substrate 100 through the dielectric layer 113, the floating gate 112, and the tunneling gate insulation layer 111.

The first select gate 130 is formed on a side of the first gate stack 110 and may comprise a conductive material such as a poly-Si layer. The first gate stack 110 includes the floating gate 112 and the control gate 114. Therefore, it may be seen that the first select gate 130 is disposed on sides of the floating gate 112 and the control gate 114. In other words, the first select gate 130 is disposed adjacent to the floating gate 112 and the control gate 114. The first select gate 130 may be disposed adjacent to one side of the first source region 160.

The first select gate insulation layer 150*a* may be disposed between the first select gate 130 and the first gate stack 110, and between the first select gate 130 and the substrate 100. In other words, the first select gate insulation layer 150*a* may be disposed on an upper surface of the substrate 100 and a side surface of the first gate stack 110.

The first source region 160 may include a first shallow source region 161 and a first deep source region 162. The first select gate 130, the first select gate insulation layer 150*a* and a first spacer 151 may be disposed near the first source region 160.

The drain region 170 may include a shallow drain region 171 and a deep drain region 172. The floating gate 112, the control gate 114, and a third spacer 153 may be disposed near the drain region 170.

The first spacer 151, a second spacer 152, and the third spacer 153 may be disposed on a side surface of the first select gate 130 or the first gate stack 110. The aforementioned first spacer 151, second spacer 152 and third spacer 153 may comprise double insulation layers in which silicon oxide layers 108*a*, 108*b* and 108*c*, and silicon nitride layers 109*a*, 109*b* and 109*c* are stacked. The afore-mentioned first spacer 151, second spacer 152 and third spacer 153 may also comprise triple insulation layers (not shown) in which a silicon oxide layer, a silicon nitride layer, and a silicon oxide layer are stacked.

The first spacer 151 may be disposed on a lower sidewall of the first select gate 130, and may be disposed adjacent to the first source region 160. The first spacer 151 may be disposed in contact with one side of the first select gate 130 and a portion of the first source region 160 of the substrate 100. In addition, the first spacer 151 may be disposed in contact with a first select gate silicide layer 320 and a first source silicide layer 330.

The second spacer 152 may be disposed on an upper sidewall of the first select gate 130. The second spacer 152 may be disposed over the first select gate 130 and the first gate stack 110. The second spacer 152 may be disposed to be spaced apart from the first spacer 151. Additionally, the second spacer 152 may be disposed in contact with the first select gate insulation layer 150*a*, the first control gate silicide layer 310, and the first select gate silicide 320.

The second spacer 152 may insulate the first gate stack 110 and the first select gate 130 from each other. Therefore, the second spacer 152 may solve the short circuit problem caused by a short distance between the first control gate 114 of the first gate stack 110 and the first select gate 130.

The first control gate silicide layer 310 and a first select gate silicide layer 320 may be disposed on the first gate stack 110 and the first select gate 130, respectively. When a maximum height H1 of the first select gate 130 becomes substantially close to a height H2 of the first gate stack 110, the first select gate silicide layer 320 may meet the first control gate silicide layer 310.

When the first select gate silicide layer 320 and the first control gate silicide layer 310 meet each other, a short circuit problem occurs. To solve this problem, it is recommended that the first select gate silicide layer 320 should be far away from the first control gate silicide layer 310.

The height H1 of the first select gate 130 should be lower than the height H2 as much as possible. It is preferable to make the maximum height H1 of the first select gate 130 overlap the middle of the first control gate 114.

That is, it is preferable that the maximum height H1 of the first select gate 130 positions between the dielectric layer 113 and the first control gate silicide layer 310. As the maximum height H1 of the first select gate 130 gets close to the dielectric layer 113, the device safely operates free from the short-circuit.

The third spacer 153 may be disposed on the other side of the first gate stack 110 in a direction of the drain region 170. The third spacer 153 may be formed in an L shape in a direction of the drain region 170 of the first gate stack 110. A lower portion of the third spacer 153 may be disposed in contact with the drain region 170.

As will be described later, the third spacer 153 may be disposed to be spaced apart from a sixth spacer 156 having a symmetric configuration with respect to the drain region 170. When ions are implanted into the space spaced between the third spacer 153 and the sixth insulation layer spacer 156, the third spacer 153 and the sixth spacer 156 may function as a mask and form a portion of the drain region 170 as the shallow drain region 171 and the deep drain region 172.

The above-described first spacer 151, second spacer 152, and third spacer 153 may be disposed on entire surfaces of the substrate 100, the first gate stack 110, and the first select gate 130 by depositing the silicon oxide layers 108a, 108b, and 108c and the silicon nitride layers 109a, 109b, and 109c thereon using a chemical vapor deposition (CVD) method and etching them.

The first control gate silicide layer 310 may be disposed on an upper surface of the first gate stack 110. The first control gate silicide layer 310 may be disposed on an upper surface of the control gate 114 by the salicide process. The first control gate silicide layer 310 may transmit a voltage from the word line to the control gate 114.

The first select gate silicide layer 320 may be disposed on the first select gate 130 between the first and second insulating spacers 151 and 152, which are spaced apart from each other. The first select gate silicide layer 320 may transmit a voltage from a selection gate line to the first select gate 130.

The first source silicide layer 330 may be disposed in a portion of the first source region 160 in contact with a lower portion of the first spacer 151. The first source silicide layer 330 may be disposed in a portion of the first source region 160 by the salicide process.

A drain silicide layer 340 may be disposed in a portion of the drain region 170. The drain silicide layer 340 may be disposed in a portion of the drain region 170 by the salicide process.

An etch-stop layer 380 may be disposed on the silicide layers 310, 320, 330, and 340. The etch-stop layer 380 may serve as an etch-stop layer during a process for forming a contact plug. The etch-stop layer 380 may comprise a single layer or a double layer of SiO2, SiN, SiON, SiOCN, or the like.

Figure 3:
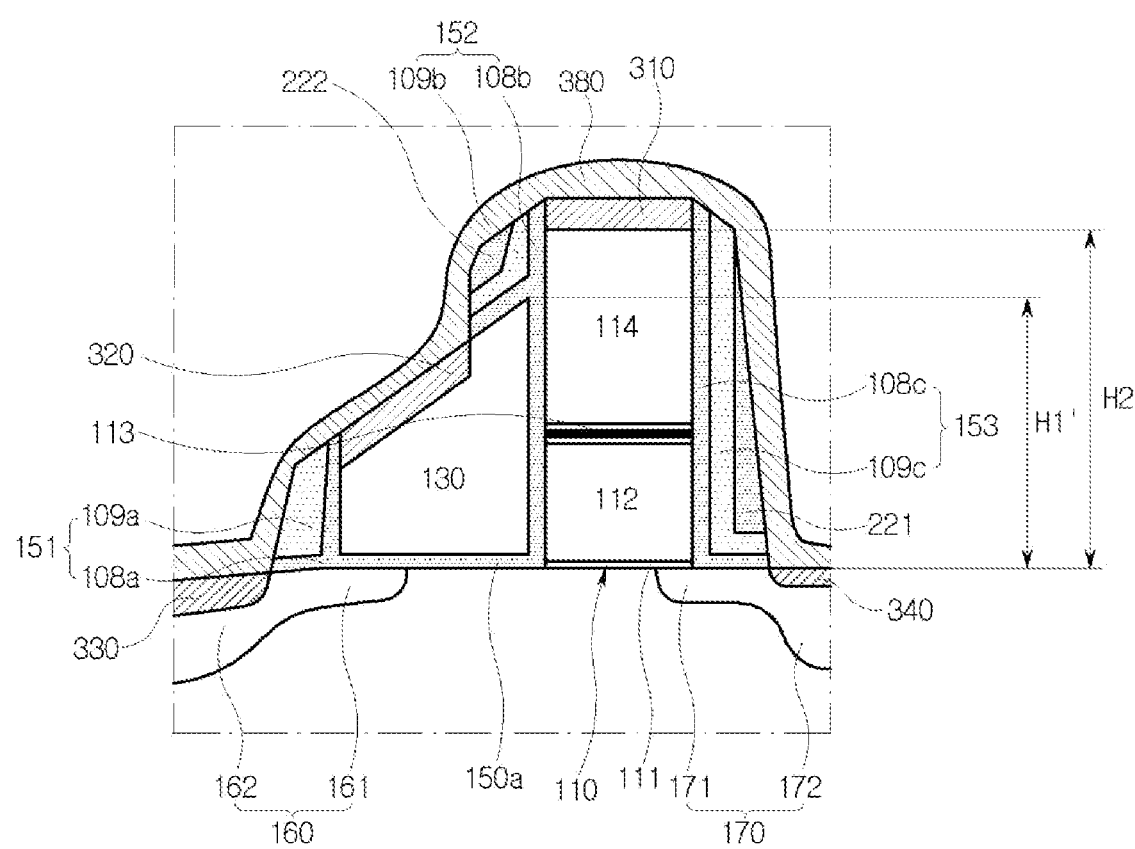
FIG. 3 illustrates a cross-sectional view of a flash cell structure of a non-volatile memory semiconductor device according to one or more embodiments of the present disclosure.

FIG. 3 illustrates a cross-sectional view of a flash cell structure of a non-volatile memory semiconductor device according to another embodiment of the present disclosure. FIG. 3 is a cross-sectional view of the A-A' portion of FIG. 1, showing the cross-section between the source region and the drain region in a single cell.

Referring to FIG. 3, the first spacer 151 may comprise at least two insulating layers 108a and 109a. On the other hand, the second spacer 152 may comprise at least three insulating layers 108b, 109b, and 222. The third space 153 may also comprise at least three insulation layers 108c, 109c, and 221. The first insulation layers 108a, 108b and 108c may comprise oxide layers. The second insulation layers 109a, 109b and 109c may comprise nitride layers. The third insulating layers 221 and 222 may comprise oxide layers.

Referring to FIG. 3, the first select gate 130 has a height H1' lower than a height H1 of the first select gate 130 shown in FIG. 2. As described above with reference to FIG. 2, the first control gate silicide layer 310 and the first select gate silicide layer 320 may be disposed on the first gate stack 110 and the first select gate 130, respectively.

When the maximum height H1' of the first select gate 130 becomes substantially close to the height H2 of the first gate stack 110, the first select gate silicide layer 320 may meet the first control gate silicide layer 310.

When the first select gate silicide layer 320 and the first control gate silicide layer 310 meet each other, a short circuit problem occurs. To solve this problem, it is necessary to make the height H1' of the first select gate 130 lower than the height H2 of the first gate stack 110, if possible.

It is preferable to make the maximum height H1' of the first select gate 130 overlap the first control gate 114. That is, it is preferable that the maximum height H1' of the first select gate 130 is located between the dielectric layer 113 and the first control gate silicide layer 310.

As the maximum height H1' of the first select gate 130 decreases, the distance between the first control gate silicide layer 310 and the first select gate silicide layer 320 may increase. Then, the short circuit problem caused by the short distance therebetween may be resolved.

Figure 4:
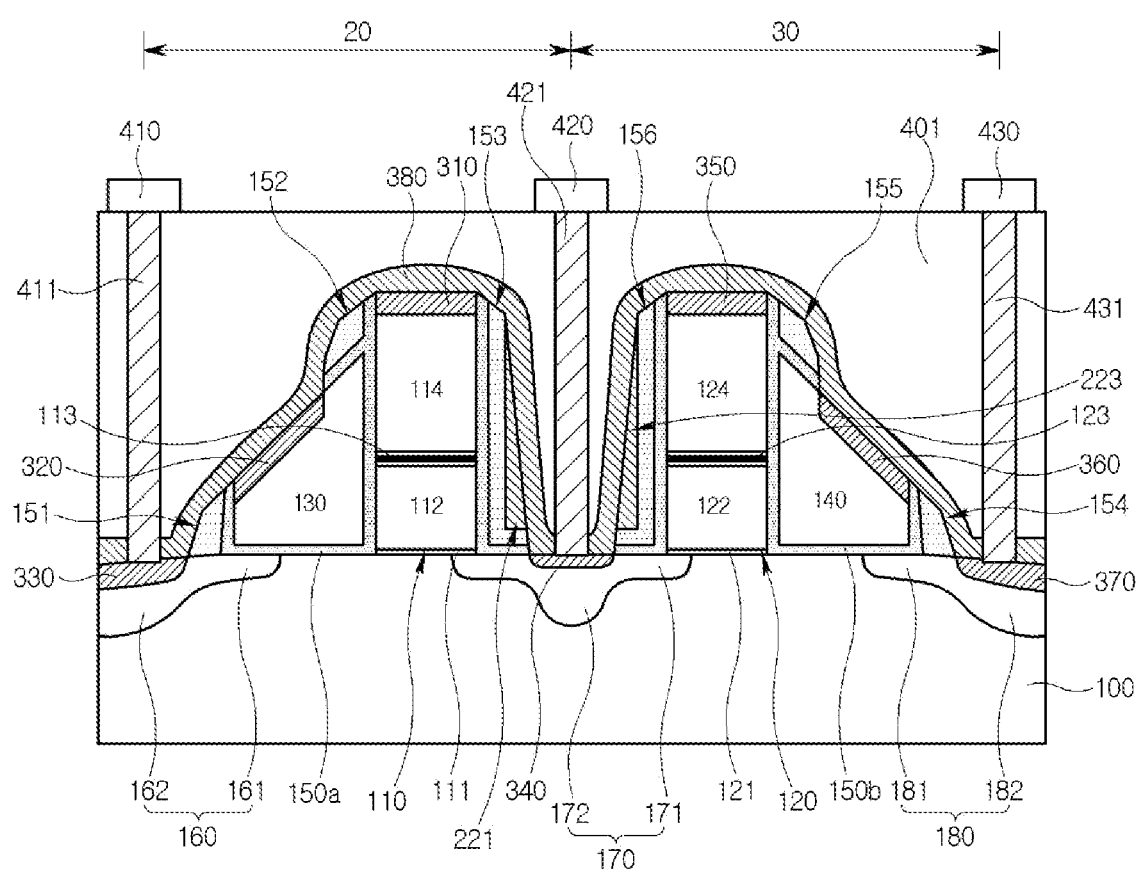
FIG. 4 illustrates a cross-sectional view showing a structure of two horizontally adjacent cells of a non-volatile memory semiconductor device according to one or more embodiments of the present disclosure.

FIG. 4 illustrates a cross-sectional view showing a structure of two horizontally adjacent cells of a non-volatile memory semiconductor device according to one or more embodiments of the present disclosure. FIG. 4 is a cross-sectional view of part B-B' of FIG. 1.

Referring to FIG. 4, adjacent cells may be symmetrically positioned with respect to the drain region 170. Each configuration of the symmetric cells may have the same structure and function.

A second source region 180 may be disposed on the opposite side of the first source region 160 with respect to the drain region 170 on the substrate 100.

A second gate stack 120 may be symmetrical to the first gate stack 110 and may be disposed between the drain region 170 and the second source region 180.

The second select gate 140 may be symmetrical to the first select gate 130 and may be disposed between the second gate stack 120 and the second source region 180. The second select gate 140 may be disposed to have an inclined upper surface with a higher portion adjacent to the second gate stack 120 and a lower portion adjacent to the second source region 180.

A second select gate insulation layer 150b may be symmetrical to the first select gate insulation layer 150a, and may be disposed between the second select gate 140 and the second gate stack 120 and between the second select gate 140 and the substrate 100.

A fourth spacer 154 may be symmetrical to the first spacer 151 and may be disposed in contact with the second select gate 140 and the second source region 180.

A fifth spacer 155 may be symmetrical to the second spacer 152, disposed on a side surface of the second gate stack 120, and spaced apart from the fourth spacer 154.

A sixth spacer 156 may be symmetrical to the third spacer 153 and may be disposed between the second gate stack 120 and the drain region 170.

The drain silicide layer 340 may be disposed in a portion of the drain region 170. The drain silicide layer 340 may be disposed in the drain region 170 by the salicide process.

The second control gate silicide layer 350 may be symmetrical to the first control gate silicide layer 310 and may be disposed on an upper surface of the second gate stack 120.

A second select gate silicide layer 360 may be symmetrical to the first select gate silicide 320, and may be disposed on an inclined upper surface of the second select gate 140 between the fourth spacer 154 and the fifth spacer 155.

A second source silicide layer 370 may be symmetrical to the first source silicide layer 330 and may be disposed in the second source region 180.

The first source line 410 may be connected to a first source line contact plug 411. Also, the first source line contact plug 411 may be disposed in contact with the first source silicide layer 330. The first source silicide layer 330 may transmit a voltage transmitted through the first source line 410 to the first source region 160 through the first source line contact plug 411.

The bit line 420 may be connected to the bit line contact plug 421. In addition, the bit line contact plug 421 may be disposed in contact with the drain silicide layer 340. The drain silicide layer 340 may transmit a voltage transmitted through the bit line 420 to the drain region 170 through the bit line contact plug 421.

Similarly, the second source line 430 may be connected to a second source line contact plug 431. Also, the second source line contact plug 431 may be disposed in contact with the second source silicide layer 370. The second source silicide layer 370 may transmit a voltage transmitted through the second source line 430 to the second source region 180 through the second source line contact plug 431.

Figure 5:
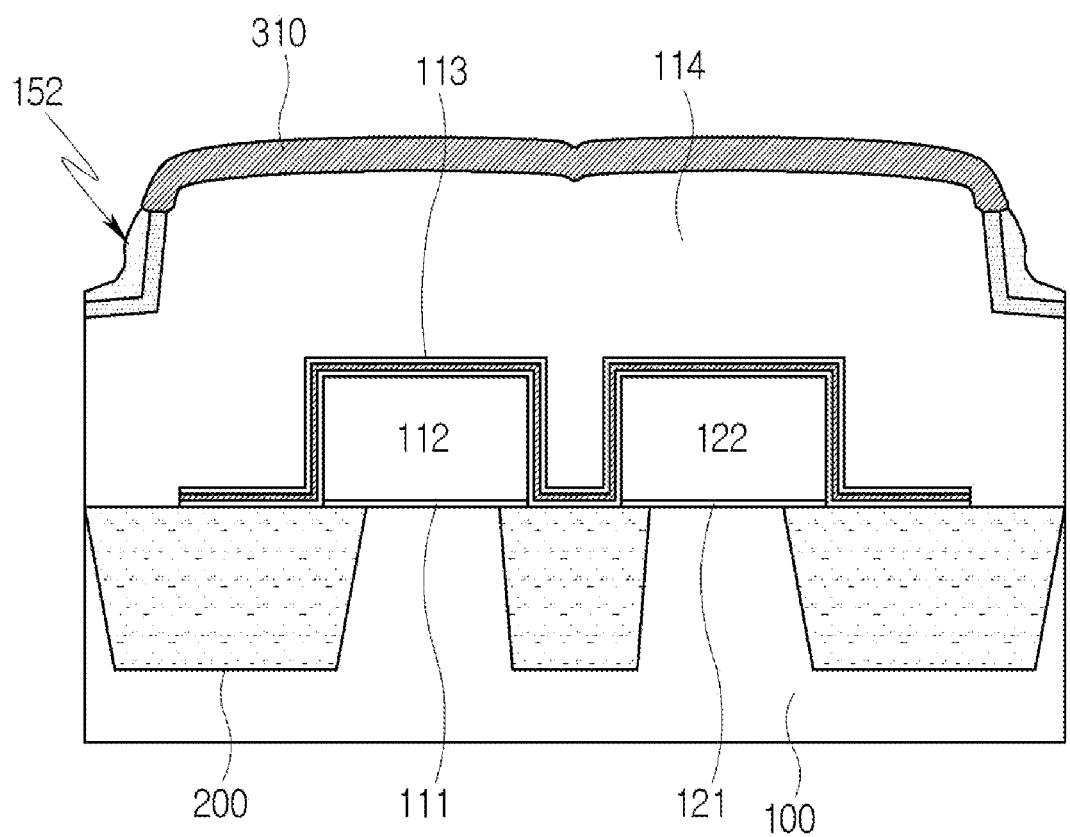
FIG. 5 illustrates a cross-sectional view showing a structure of two vertically adjacent cells of a non-volatile memory semiconductor device according to one or more embodiments of the present disclosure.

FIG. 5 illustrates a cross-sectional view showing a structure of two vertically adjacent cells of a non-volatile memory semiconductor device according to an embodiment of the present disclosure. FIG. 5 is a cross-sectional view of the C-C' portion of FIG. 1.

Referring to FIG. 5, the cells of a non-volatile memory semiconductor device may be connected in parallel.

A shallow trench isolation (STI) 200 may be disposed on the substrate 100. Tunneling gate insulation layers 111 and 121 and floating gates 112 and 122 may be stacked on the substrate 100. The dielectric layer 113 may be disposed on the STI 200, the floating gates 112 and 122. The control gate 114 may be disposed on the dielectric layer 113. As viewed in the cross-sectional view of FIG. 5, the select gate (not illustrated) may be disposed on a front or rear surface of the control gate 114. The second spacer 152 may be disposed to insulate between the control gate 114 and the select gate 130. The control gate silicide layer 310 may be disposed on the upper surface of the control gate 114.

Hereinafter, a method of manufacturing the non-volatile memory semiconductor device according to one or more embodiments of the present disclosure described above will be explained.

FIGS. 6 to 22 illustrate cross-sectional views showing a series of processes in a method of manufacturing cells of a non-volatile memory semiconductor device according to one or more embodiments of the present disclosure.

Figure 6:
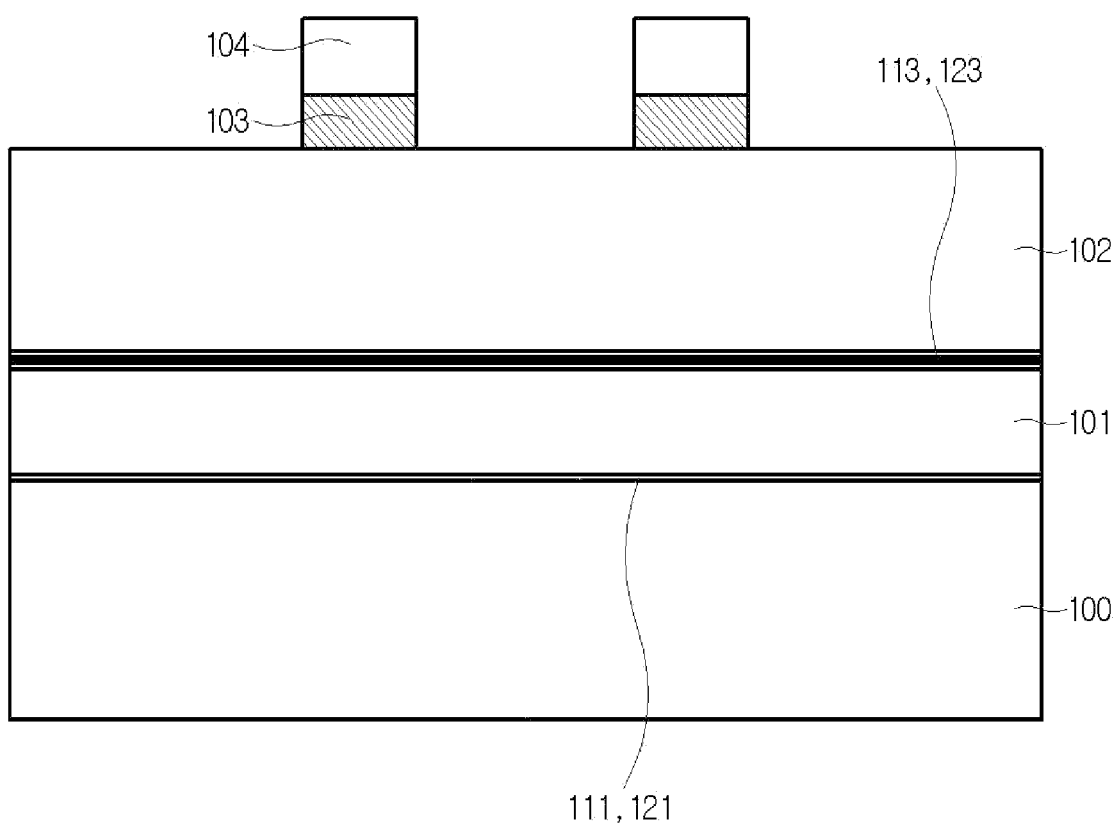
FIGS. 6 to 22 illustrate cross-sectional views showing a series of processes of methods of manufacturing cells of a non-volatile memory semiconductor device according to one or more embodiments of the present disclosure.

FIG. 6 illustrates a deposition process for forming a gate stack.

Referring to FIG. 6, a tunneling gate insulation layers 111 or 121, a first conductive film 101, for example, poly-Si layer, a dielectric layer 113 or 123, and a second conductive film 102, for example, poly-Si layer, may be sequentially stacked on the substrate 100. Stacked films including the tunneling gate insulation layers 111 or 121, the first conductive film 101, the dielectric layer 113 or 123, and the second conductive film 102 are formed on the substrate 100. The tunneling gate insulation layer 111 or 121 may comprise a single layer selected from SiO2, SiN, SiON, or a high-k dielectric layer. The tunneling gate insulation layer 111 or 121 may comprise stacked layers selected from SiO2, SiN, SiON, or a high-k dielectric layer.

Furthermore, a hard mask 103 and a first photoresist pattern 104 are formed on the second conductive film 102 to pattern the stacked films. The hard mask 103 may comprise an insulating film, such as a SiO2, SiN, or SiON material.

Figure 7:
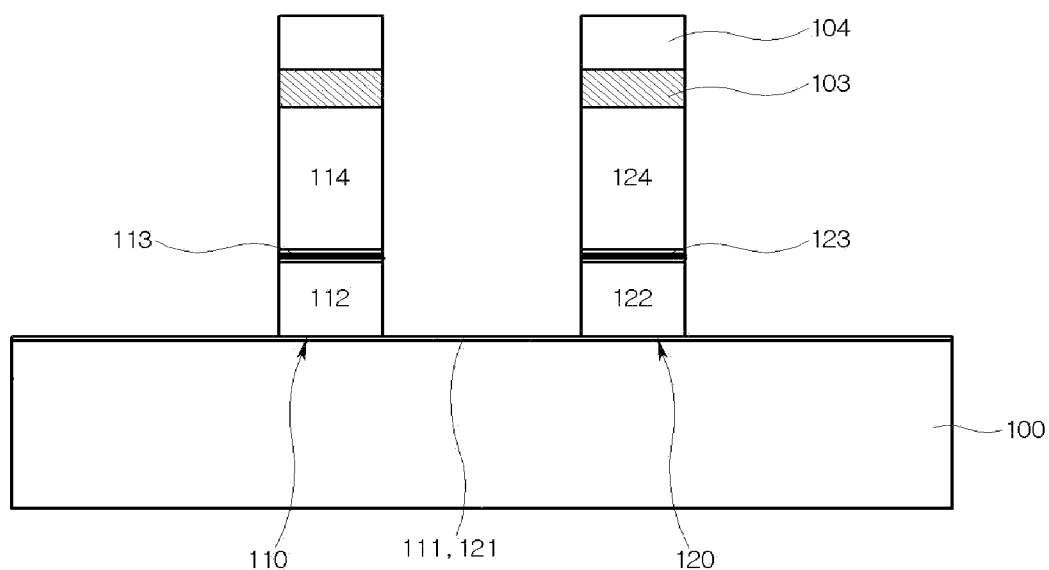

FIG. 7 illustrates a gate stack forming process.

First etching process may be performed on the stacked films to form a first gate stack 110 and a second gate stack 120 implemented by the hard mask 103 and the first photoresist pattern 104 as mask. Here, the first gate stack 110 and the second gate stack 120 may be disposed to be symmetrical to each other. The first gate stack 110 may comprise a first tunneling gate insulator 111, a first floating gate 112, a first dielectric layer 113 and a first control gate 114, as well as the hard mask 103. The second gate stack 120 may comprise a second tunneling gate insulator 121, a second floating gate 122, a second dielectric layer 123 and a second control gate 124, as well as the hard mask 103.

The first photo resistor pattern 104 may be removed after forming the first gate stack 110 and the second gate stack 120. The hard masks 103 may be still remained as a protective film for the first gate stack 110 and the second gate stack 120.

Figure 8:
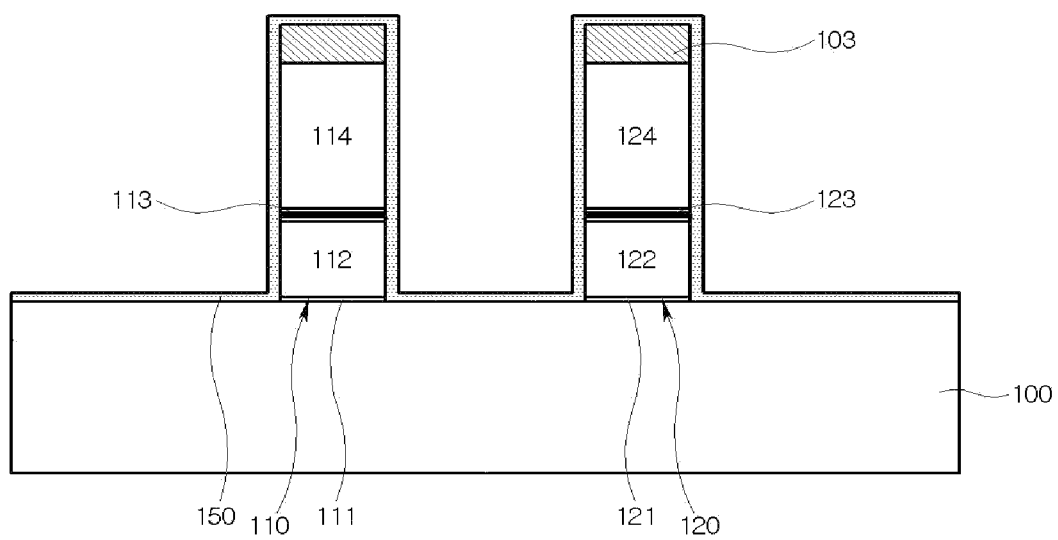

FIG. 8 illustrates a deposition process of the select gate insulation layer.

Referring to FIG. 8, a select gate insulation layer 150 is deposited on the substrate 100, the first gate stack 110, the second gate stack 120, and the hard mask 103. The select gate insulation layer 150 may comprise any one or a plurality of SiO2, SiN, or SiON material layers.

Figure 9:
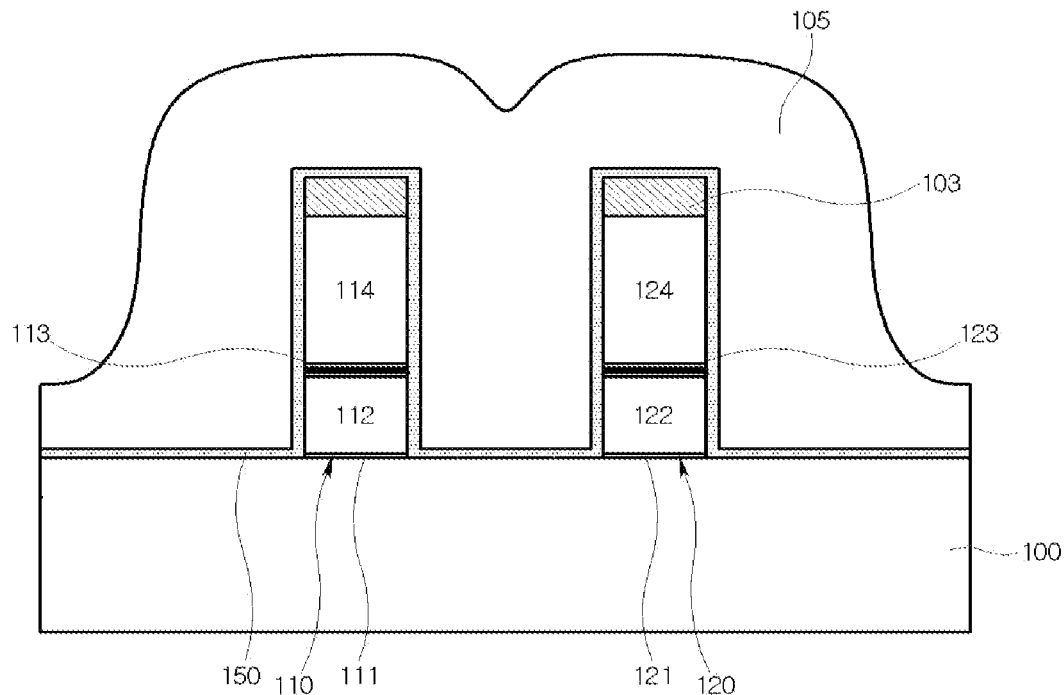

FIG. 9 illustrates a conductive layer deposition process to form the select gate.

Referring to FIG. 9, a third conductive layer 105 may be deposited on an upper surface of the select gate insulation layer 150. Here, the conductive layer 105 may comprise a doped poly-Si layer, a undoped poly-Si layer or metal layer. The third conductive layer 105 may be formed conformally with a constant thickness by a low-pressure chemical vapor deposition (LPCVD) method. Among the doped poly-Si layer, heavily doped poly-Si layer may be implemented to lower a resistance of the third conductive layer 105.

Figure 10:
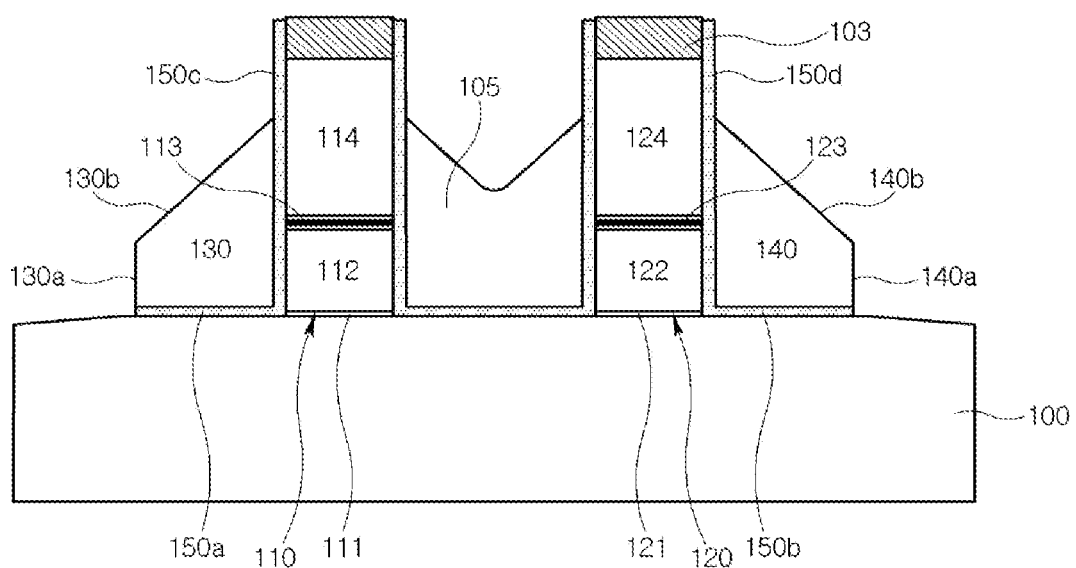

FIG. 10 illustrates a first etch-back process of the third conductive layer 105.

Referring to FIG. 10, the first etch-back process may be performed on the third conductive layer 105 to form a first select gate 130 and a second select gate 140. The third conductive layer 105 may be shaped as a spacer on the sidewalls of the first gate stack 110 and the second gate stack 120 after the first etch-back process. The maximum height of the first select gate 130 and the second select gate 140 may be lower than the top surfaces of the first and second control gates 114 and 124. Additionally, both ends of the first select gate 130 and the second select gate 140 may have a near-vertical profile. However, the shape may vary depending on the thickness of the third conductive layer 105 of FIG. 9.

The first side surface 130a and the second side surface 130b of the first select gate 130 may have a sustainable vertical angle and an inclination angle, respectively, with a respect to the sidewall of the first gate stack 110. Similarly, a first side surface 140a and second side surface 140b of the second select gate 140 may have a sustainable vertical angle and an inclination angle, respectively, with a respect to the sidewall of the second gate stack 120.

The third conductive layer 105 may still remain between the first gate stack 110 and the second gate stack 120 as a remaining third conductive layer 105. However, the select gate insulation layer 150 may be removed from the top surface of the hard mask after the first etch-back process.

Referring to FIG. 10, after the first etch-back process, vertical sidewalls 150c and 150d of the first and second select gate insulation layers 150a and 150b are clearly exposed. The first and second vertical sidewalls 150c and 150d may provide sufficient space to form insulating spacers 152 and 155 (See FIG. 17) that are required to separate silicide layers 310 and 320 formed on the control gates 114 and 124 and the select gates 130 and 140 (See FIG. 20).

Figure 11:
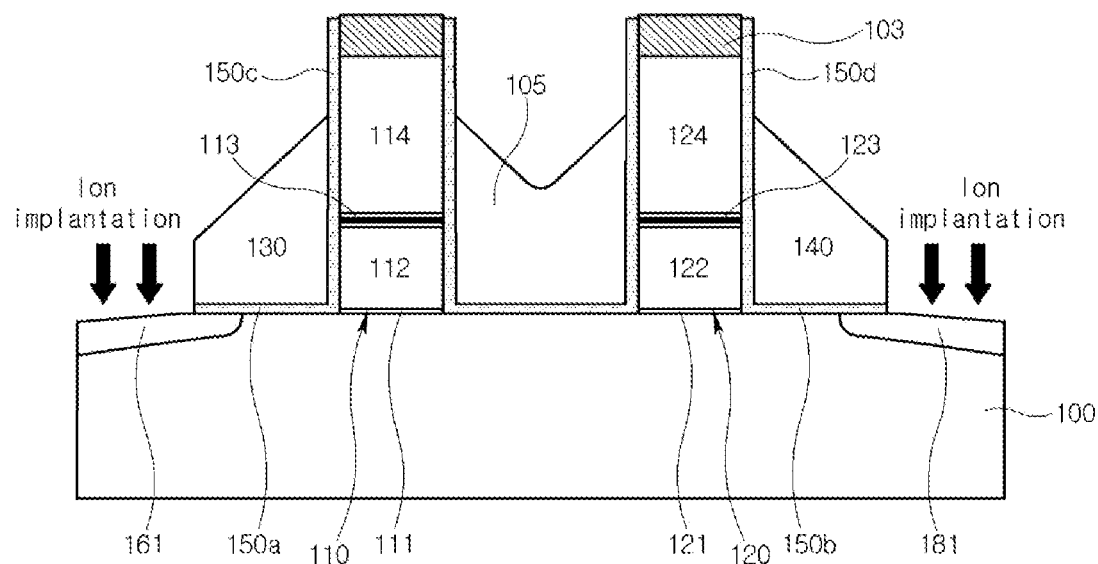

FIG. 11 illustrates an ion implantation process for forming a shallow source region.

Referring to FIG. 11, an ion implantation process may be performed to form a first shallow source region 161 and a second shallow source region 181 on the substrate 100 other than a region covered by the conductive layer. The first shallow source region 161 and the second shallow source region 181 may also be referred to as lightly-doped drain (LDD) regions.

Figure 12:
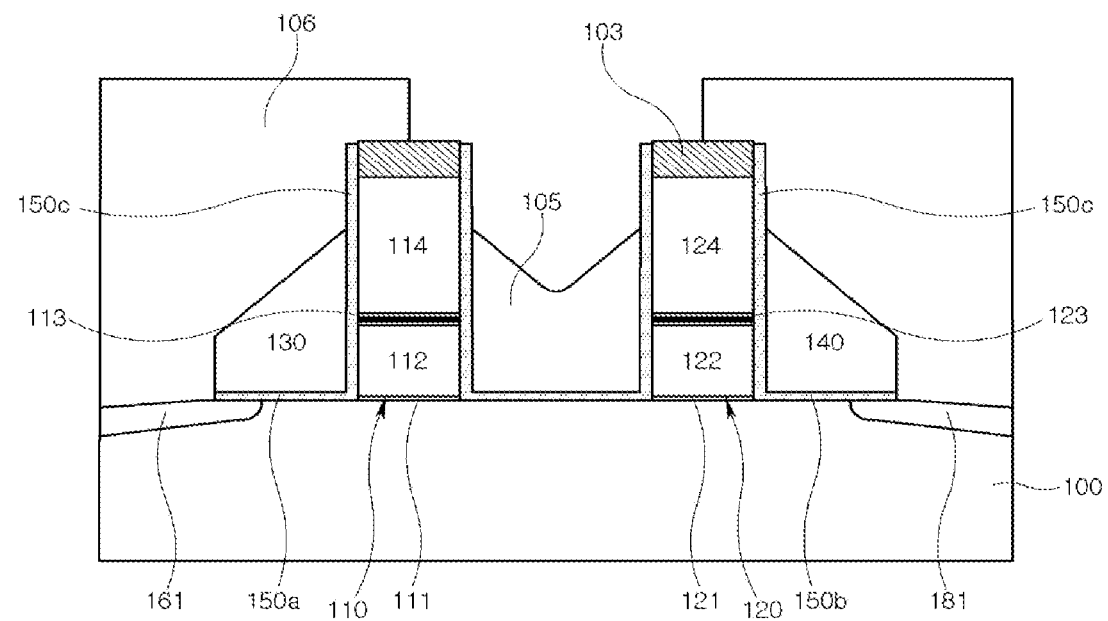

FIG. 12 illustrates a removing process of the remaining third conductive layer 105.

Referring to FIG. 12, a second photo resistor pattern 106 may be formed to expose the remaining third conductive layer 105 disposed between the first gate stack 110 and the second gate stack 120.

Figure 13:
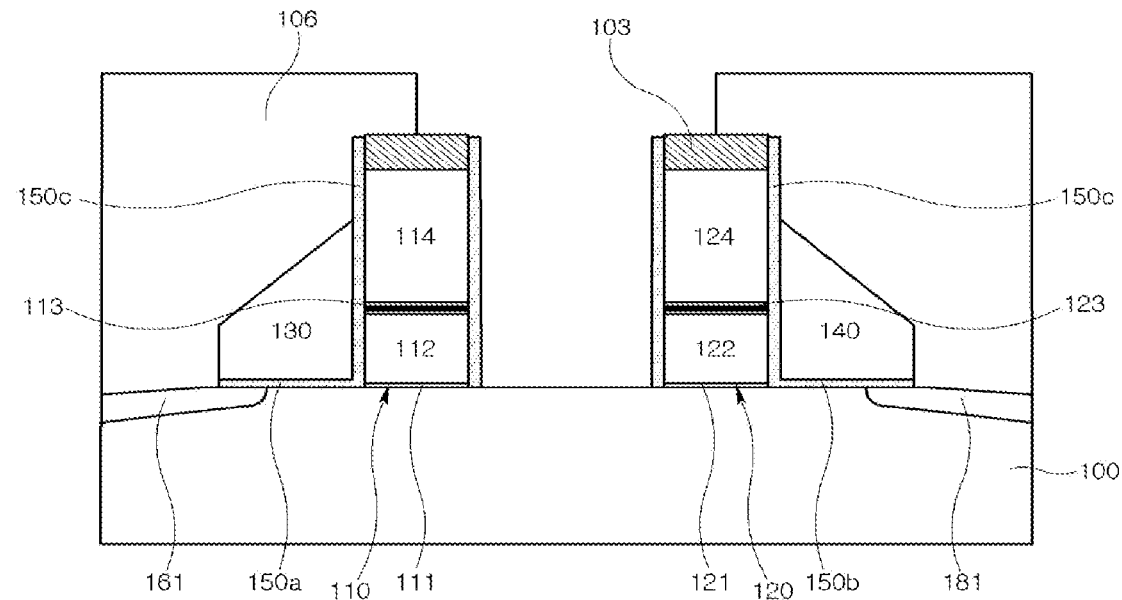

FIG. 13 illustrates a second etching process of the remaining third conductive layer.

Referring to FIG. 13, the second etching process may be performed to remove the remaining conductive layer 105 disposed between the first gate stack 110 and the second gate stack 120 implemented by the second photo resistor pattern 106. After the second etching process, a thickness of the hard mask 103 may be slightly reduced.

The select gate insulation layer 150 disposed between the first gate stack 110 and the second gate stack 120 may be removed after the second etching process. Then, a top surface of the substrate 100 may be exposed. The first select gate insulation layer 150a and the second select gate insulation layer 150b still remain on sides of the first gate stack 110 and the second gate stack 120, respectively.

Figure 14:
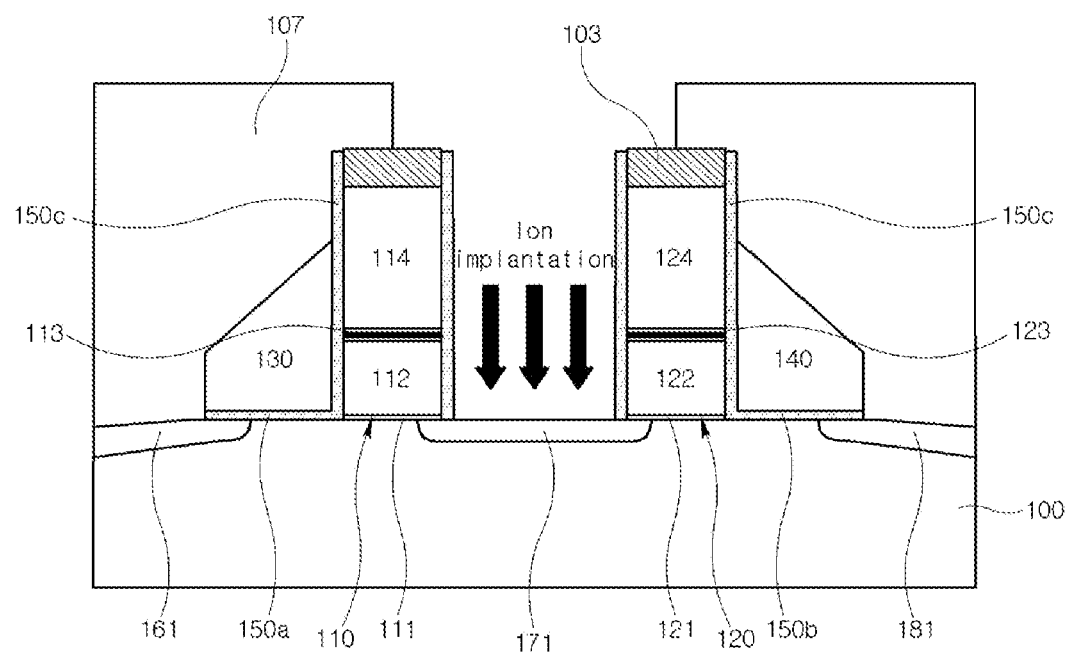

FIG. 14 illustrates an ion implantation process for forming the shallow drain region.

Referring to FIG. 14, an ion implantation process for forming the shallow drain region 171 is performed with a third photo resistor pattern 107. To reduce a fabrication cost, the second photo resistor pattern 106 may be implemented to form the shallow drain region 171, instead of the third photo resistor pattern 107. The shallow drain region 171 may be formed in an upper portion of the substrate 100 between the first gate stack 110 and the second gate stack 120. The third photo resistor pattern 107 is removed after the ion implantation process for forming the shallow drain region 171.

Figure 15:
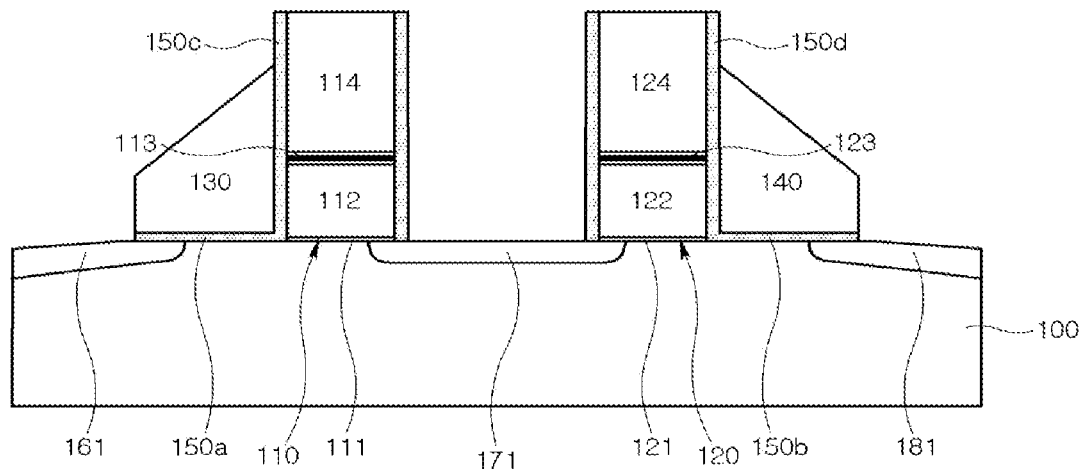

FIG. 15 illustrates a third etching process for removing the hard mask.

Referring to FIG. 15, the third etching process may be performed to remove the hard mask 103 disposed on the first gate stack 110 and the second gate stack 120. As described above, vertical sidewalls 150c and 150d of the first and second select gate insulation layers 150a and 150b are clearly exposed. The first and second vertical sidewall 150c and 150d may provide sufficient space to form insulating spacers 152 and 155 (See FIG. 17) that are required to separate silicide layers 310 and 320 formed on the control gates 114 and 124 and the select gates 130 and 140 (See FIG. 20).

Figure 16:
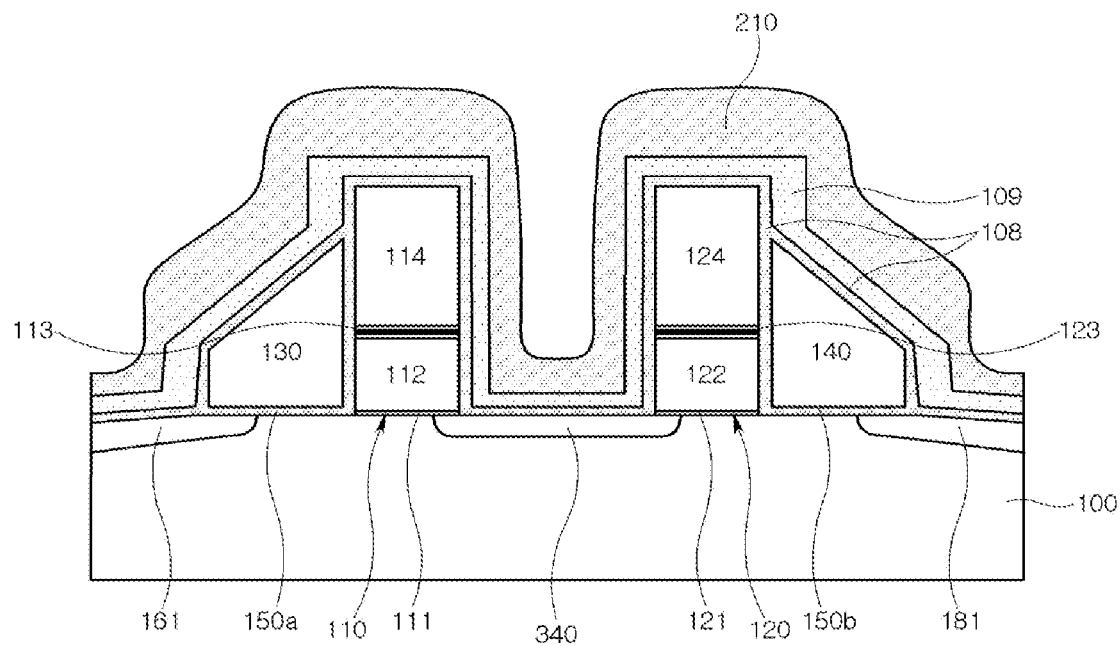

Referring to FIG. 16, a process of forming the spacer insulation layers is performed.

The process of forming the insulating spacer layers aims to form the first to sixth insulation layer spacers 151 to 156 on side surfaces of the first and second stack gates 110 and 120, respectively. In the process of forming the spacer insulation layers, a first spacer insulation layer 108, a second spacer insulation layer 109, and a third spacer insulation layer 210 are deposited sequentially.

Therefore, the first to third spacer insulation layers 108, 109, and 210 may be deposited on the first select gate insulation layer 150a, the second select gate insulation layer 150b, the first gate stack 110, and the second gate stack 120, the first select gate 130 and the second select gate 140.

Here, a silicon oxide layer may be deposited as the first spacer insulation layer 108. A silicon nitride layer may be deposited as the second spacer insulation layer 109. A silicon oxide layer may be deposited as the third spacer insulation layer 210. The silicon oxide layer and the silicon nitride layer may be deposited conformally by chemical vapor deposition (CVD).

The first spacer insulation layer 108 and the third spacer insulation layer 210 may be made of the same material as the select gate insulation layers 150a and 150b. The first spacer insulation layer 108 may be combined with the select gate insulation layers 150a and 150b to be combined into one layer during the deposition process.

Figure 17:
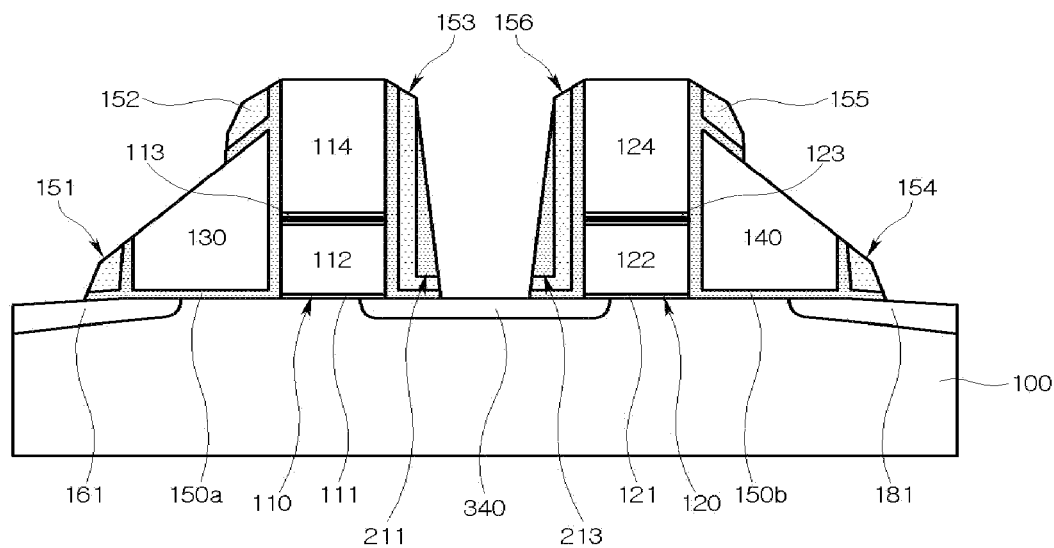

Referring to FIG. 17, a second etch-back process for forming spacers is performed.

The first spacer 151 to the sixth spacer 156 may be formed by performing the second etch-back process on the triple-deposited insulation layers 108, 109, and 210.

The first spacer 151 and the second spacer 152 are simultaneously formed on the lower sidewall and the upper sidewall of the first select gate 130, respectively. The first spacer 151 may be formed on one side of the first select gate 130. In addition, the second spacer 152 may be spaced apart from the first spacer 151 and formed on one side of the first gate stack 110. In addition, the third spacer 153 may be formed on the other side of the first gate stack 110.

In addition, the fourth spacer 154 is symmetrical to the first spacer 151 and may be formed on one side of the second select gate 140. In addition, the fifth spacer 155 is symmetrical to the second spacer 152 and may be formed on one side of the second gate stack 120. In addition, the sixth spacer 156 is symmetrical to the third spacer 153 and may be formed on the other side of the second gate stack 120.

As a result, the first spacer 151 and the fourth spacer 154 may be formed on the sides of the first select gate 130 and the second select gate 140.

In addition, the second spacer 152 and the fifth spacer 155 may be formed on sides of the first gate stack 110 and the second gate stack 120, respectively.

In addition, the third spacer 153 and the sixth spacer 156 may be spaced apart from each other and formed on the other side of the first gate stack 110 and the second gate stack 120, respectively.

As described above, the second spacer 152, the fifth spacer 155, the third spacer 153, and the sixth spacer 156 may comprise a double insulation layer, or triple insulation layer depending on an etching method.

Figure 18:
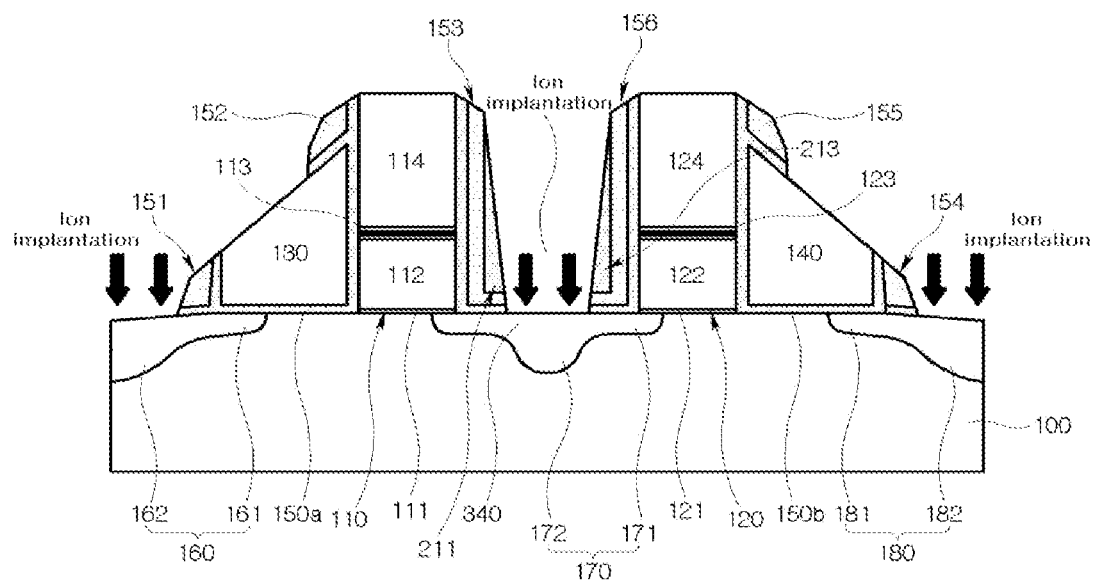

Referring to FIG. 18, an ion implantation process for forming the source-drain regions is performed.

That is, the deep source regions 162 and 182 may be formed by implanting ions into a portion of the first shallow source region 161 and a portion of the second shallow source region 181, respectively. In addition, the deep drain region 172 may be formed by implanting ions into a portion of the shallow drain region 171.

The first source region 160 may include the first shallow source region 161 and the first deep source region 162. The second source region 180 may include the second shallow source region 181 and the second deep source region 182. The drain region 170 may include the shallow drain region 171 and the deep drain region 172.

When ions are implanted into the first shallow source region 161, the first spacer 151 serves as a mask, and a lower portion of the first spacer 151 maintains the first shallow source region 161 and the remaining portion may form the first deep source region 162.

In addition, when ions are implanted into the second shallow source region 181, the fourth spacer 154 serves as a mask, and a lower portion of the fourth spacer 154 maintains the second shallow source region 181, and the remaining portion may form the first deep source region 182.

In addition, when ions are implanted into the shallow drain region 171, the third spacer 153 and the sixth spacer 156 serve as masks, and lower portions of the third spacer 153 and the sixth spacer 156 maintain the shallow drain region 171 and the remaining portion may form the deep drain region 172.

Figures 19, 20:
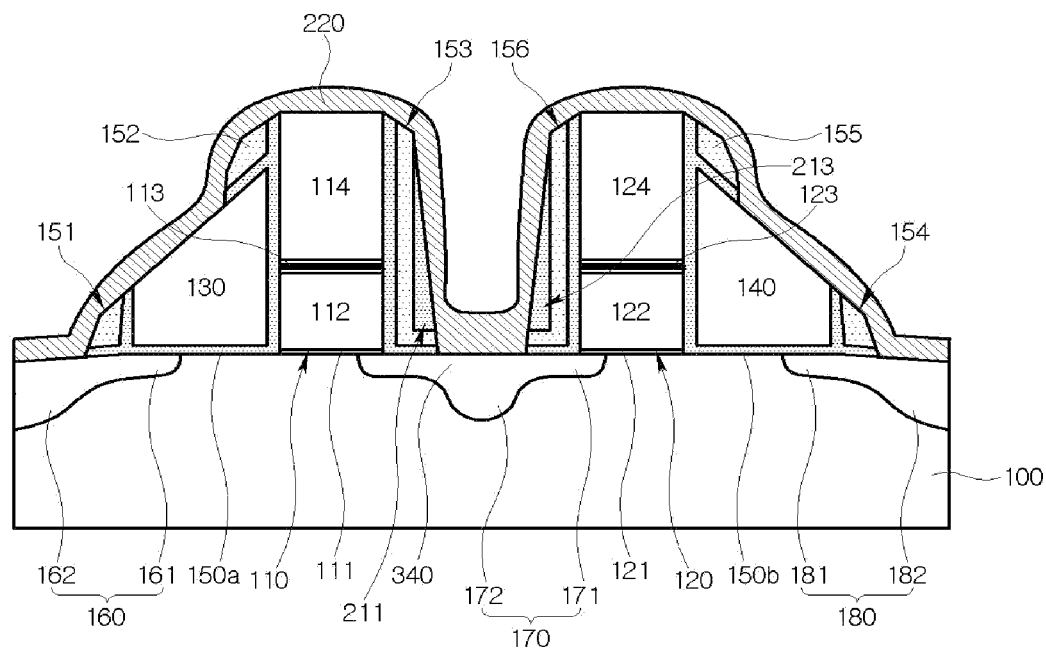

Referring to FIG. 19, a process of forming the salicide blocking insulation layer may be performed. The silicide blocking insulation layer 220 may be deposited to protect a region where the silicide layer is not formed. Here, the silicide blocking insulation layer 220 may comprise SiO2, SiN, SiON, or the like.

The silicide blocking insulation layer 220 is patterned to expose each top surface of the first control gate 114, the second control gates 124, the first select gate 130 and the second select gate 140, as well as top surface of the substrate 100 to form silicide layers 310 to 370.

Referring to FIG. 20, a salicide process for forming the silicide layers is performed.

After forming the source regions 160 and 180 and the drain region 170, the first and second gate silicide layers 310 and 350, the first and second select gate silicide layers 320 and 360, the drain silicide layer 340 and the first and second source silicide layers 330 and 370 may be formed through the salicide process.

The first and second gate silicide layers 310 and 350 provided on upper surfaces of the first gate stack 110 and the second gate stack 120 may be formed.

In addition, the first select gate silicide layer 320 provided on an inclined upper surface of the first select gate 130 may be formed between the first spacer 151 and the second spacer 152, which are spaced apart from each other, and the second select gate silicide layer 360 may be formed on an inclined upper surface of the second select gate 140.

In addition, the drain silicide layer 340 provided in the deep drain region 172 may be formed. In addition, the first and second source silicide layers 330 and 370 may be formed in the first source region 160 and the second source region 180.

Figures 21, 22:
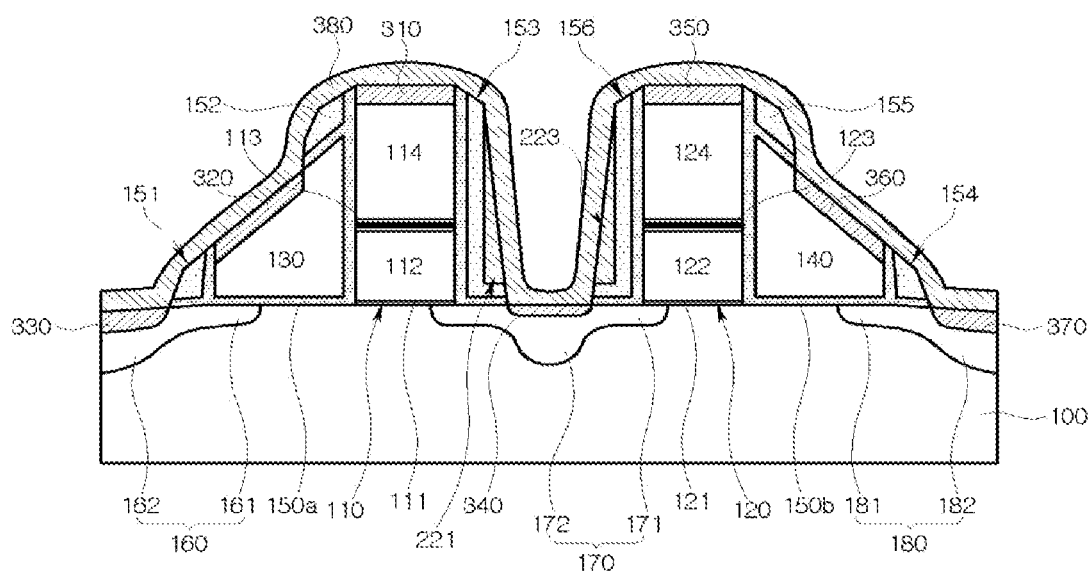

Referring to FIG. 21, an etch-stop layer deposition process for contact etching is performed.

The etch-stop layer 380 may be formed on the silicide layers 310, 320, 330, and 340. The etch-stop layer 380 may serve as an etch-stop layer in a contact plug forming process. The etch-stop layer 380 may comprise a single layer or a double layer made of SiO2, SiN, SiON, or SiOCN.

Referring to FIG. 22, a contact plug forming and metal wiring process are performed.

Before forming the contact plug and the metal wiring, an interlayer insulation layer 401 is deposited. Then, the interlayer insulation layer 401 is etched to form a contact hole (not illustrated). A plurality of contact plugs 411, 421, and 431 are formed in the interlayer insulation layer 401 by using a material such as tungsten (W), copper (Cu) or the like for contact holes (not illustrated). Then, a plurality of metal wires 410, 420, and 430 electrically connected to the plurality of contact plugs 411, 421, and 431 are formed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
   a first source region and a drain region disposed on a substrate;
   a first gate stack comprising a first floating gate and a first control gate, and disposed between the first source region and the drain region;
   a first select gate disposed on one sidewall of the first gate stack;
   a first spacer disposed on a lower sidewall of the first select gate, and disposed adjacent to the first source region;
   a second spacer disposed on an upper sidewall of the first select gate;
   a first control gate silicide layer disposed on the first control gate; and a first select gate silicide layer disposed on the first select gate, and disposed between the first spacer and the second spacer.

2. The semiconductor device of claim 1, further comprising:
a third spacer disposed on the other sidewall of the first gate stack and disposed adjacent to the drain region.

3. The semiconductor device of claim 1, further comprising:
a first tunneling gate insulation layer disposed between the first floating gate and the substrate;
a first select gate insulation layer disposed between the first select gate and the substrate;
a drain silicide layer disposed on the drain region; and
a first source silicide layer disposed on the first source region.

4. The semiconductor device of claim 1, wherein the first select gate has a height lower than a height of the first control gate silicide layer.

5. The semiconductor device of claim 1, wherein the second spacer contacts the first select gate, the first control gate silicide layer, and the first select gate silicide layer.

6. The semiconductor device of claim 2, further comprising:
a second source region disposed on the substrate;
a second gate stack comprising a second floating gate and a second control gate, and disposed between the second source region and the drain region;
a second select gate disposed on one sidewall of the second gate stack; and
a second select gate insulation layer disposed between the second select gate and the substrate.

7. The semiconductor device of claim 6, further comprising:
a fourth spacer disposed on a lower sidewall of the second select gate, and disposed adjacent to the second source region;
a fifth spacer disposed on an upper sidewall of the second select gate;
a second control gate silicide layer disposed on the second control gate; and
a second select gate silicide layer disposed on the second select gate, and disposed between the fourth spacer and the fifth spacer.

8. The semiconductor device of claim 7, further comprising:
a sixth spacer disposed on the other sidewall of the second gate stack, and disposed adjacent to the drain region.

9. A semiconductor device, comprising:
a gate stack comprising a floating gate and a control gate disposed on a substrate;
a select gate disposed on one sidewall of the gate stack;
a select gate insulation layer disposed between the substrate and the select gate;
a control gate silicide layer disposed on the control gate;
a select gate silicide layer disposed on the select gate;
a first spacer disposed on a lower sidewall of the select gate;
a second spacer disposed on an upper sidewall of the select gate; and
a third spacer disposed on the other sidewall of the gate stack,
wherein the select gate silicide layer is disposed between the first spacer and the second spacer.

10. The semiconductor device of claim 9, further comprising:
a source region disposed adjacent to the first spacer;
a drain region disposed adjacent to the third spacer;
a source silicide layer disposed on the source region;
a drain silicide layer disposed on the drain region; and
an etch-stop layer disposed on the source and drain silicide layers.

11. The semiconductor device of claim 9, wherein the select gate has a height lower than a height of the control gate silicide layer.

12. The semiconductor device of claim 9, wherein the second spacer contacts the select gate, the control gate silicide layer, and the select gate silicide layer.

13. The semiconductor device of claim 9, wherein the gate stack further comprises:
a tunneling gate insulation layer disposed between the floating gate and the substrate; and
a dielectric layer disposed between the floating gate and the control gate.

* * * * *